(12) United States Patent
Dixit et al.

(10) Patent No.: US 10,178,803 B2
(45) Date of Patent: Jan. 8, 2019

(54) THERMOSYPHON COOLING APPARATUS WITH ISOLATION OF COOLED COMPONENTS

(71) Applicant: EATON CORPORATION, Cleveland, OH (US)

(72) Inventors: Abhinav Dixit, Pune (IN); Atul Singhal, Pune (IN); David Glenn Woolard, Asheville, NC (US); Tarun Malik, Pune (IN)

(73) Assignee: Eaton Intelligent Power Limited (IE)

( * ) Notice: Subject to any disclaimer, the term of this patent is extended or adjusted under 35 U.S.C. 154(b) by 50 days.

(21) Appl. No.: 15/068,220

(22) Filed: Mar. 11, 2016

(65) Prior Publication Data

US 2017/0265329 A1   Sep. 14, 2017

(51) Int. Cl.
*F28D 15/02*   (2006.01)
*H05K 7/20*   (2006.01)
(Continued)

(52) U.S. Cl.
CPC ..... *H05K 7/20327* (2013.01); *F28D 1/05366* (2013.01); *F28D 15/0266* (2013.01);
(Continued)

(58) Field of Classification Search
CPC ........... H05K 7/20327; H05K 7/20309; H05K 7/20318; H05K 7/20136; H05K 7/20336; H05K 7/20809; H05K 7/20827; H05K 7/20781; H05K 2201/10106; H05K 7/2039; H05K 7/20936; F28D 15/0266; F28D 1/05366; F28D 15/0275; F28D 15/02; F28D 15/0233; F28D 15/04; F28D 15/00;
(Continued)

(56) References Cited

U.S. PATENT DOCUMENTS 3,686,598 A * 8/1972 Ozawa ................ H01F 38/30
336/175
4,750,543 A * 6/1988 Edelstein ............. F28D 15/06
126/590
(Continued)

OTHER PUBLICATIONS

Chehade et al. "Experimental investigation of thermosyphon loop thermal performance", *Energy Conversion and Management*, vol. 84, pp. 671-680, (2014).
(Continued)

*Primary Examiner* — Adam B Dravininkas
(74) *Attorney, Agent, or Firm* — Ward and Smith, P.A.

(57) ABSTRACT

An apparatus includes at least one evaporator having a surface configured for mounting of a power electronic device thereon, a condenser fluidically coupled to the at least one evaporator by at least two coolant conduits that electrically insulate the at least one evaporator from the condenser, and a dielectric coolant contained in a thermosyphon loop comprising the at least one evaporator, the condenser and the at least two coolant conduits. The at least one evaporator may include at least two evaporators fluidically coupled by at least one coupler that electrically insulates the at least two evaporators from one another. The at least one evaporator may be housed within an enclosure, and the condenser may be positioned within the enclosure or outside of the enclosure.

17 Claims, 11 Drawing Sheets

(51) Int. Cl.
*F28D 1/053* (2006.01)
*H01L 29/861* (2006.01)

(52) U.S. Cl.
CPC ....... *H01L 29/861* (2013.01); *H05K 7/20136* (2013.01); *H05K 7/20309* (2013.01); *H05K 7/20318* (2013.01)

(58) Field of Classification Search
CPC ...... F28D 15/046; F28D 15/043; F28D 15/06; F28D 7/12; F28D 2021/0021; F28F 9/027; H01L 25/072; H01L 29/861; H01L 23/4275
See application file for complete search history.

(56) References Cited

U.S. PATENT DOCUMENTS

| | | | | |
|---|---|---|---|---|
| 5,253,702 | A * | 10/1993 | Davidson | F28D 15/0233 165/104.14 |
| 5,333,677 | A * | 8/1994 | Molivadas | F03G 6/003 165/272 |
| 5,925,929 | A * | 7/1999 | Kuwahara | H01L 23/427 165/80.4 |
| 5,953,930 | A * | 9/1999 | Chu | F25B 23/006 165/104.21 |
| 6,031,751 | A * | 2/2000 | Janko | F28F 13/00 165/104.33 |
| 7,061,446 | B1 * | 6/2006 | Short, Jr. | H01Q 1/02 165/139 |
| 2002/0195242 | A1 * | 12/2002 | Garner | F28D 15/043 165/274 |
| 2003/0057546 | A1 * | 3/2003 | Memory | H05K 7/20681 257/706 |
| 2005/0257532 | A1 * | 11/2005 | Ikeda | F25B 21/02 62/3.7 |
| 2008/0099189 | A1 * | 5/2008 | Suh | F28D 15/0266 165/104.21 |
| 2011/0030400 | A1 * | 2/2011 | Agostini | F28D 15/0266 62/118 |
| 2011/0080711 | A1 * | 4/2011 | Yesin | H01L 23/427 361/700 |
| 2012/0050993 | A1 * | 3/2012 | Suzuki | H05K 7/20936 361/700 |
| 2013/0063897 | A1 * | 3/2013 | Howes | H05K 7/20936 361/700 |
| 2013/0077245 | A1 * | 3/2013 | Gradinger | F28D 1/035 361/700 |
| 2013/0107455 | A1 * | 5/2013 | Cottet | H05K 7/20672 361/694 |
| 2014/0230478 | A1 * | 8/2014 | Agostini | H05K 7/20309 62/259.2 |
| 2015/0003014 | A1 * | 1/2015 | Agostini | H05K 7/20336 361/692 |
| 2015/0022975 | A1 * | 1/2015 | Browne | H01L 23/4012 361/700 |
| 2015/0173242 | A1 * | 6/2015 | Blomberg | F28D 15/0266 62/259.2 |
| 2015/0237767 | A1 * | 8/2015 | Shedd | H05K 7/20254 165/104.31 |

OTHER PUBLICATIONS

Chehade et al. "Experimental investigations and modeling of a loop thermosyphon for cooling with zero electrical consumption", *Applied Thermal Engineering*, vol. 87, pp. 559-573, (2015).
Franco et al. "Experimental analysis of Closed Loop Two Phase Thermosyphon (CLTPT) for energy systems", *Experimental Thermal and Fluid Science*, vol. 51, pp. 302-311, (2013).
Fan et al. "An Innovative Passive Cooling Method for High Performance Light-emitting Diodes", 28th *IEEE SEMI-THERM Symposium*, (2012).
Kiseev et al. "Thermosyphons for High Power LED Lighting Products", 16th *International Heat Pipe Conference* (16th *IHPC*), Lyon, France, May 20-24, 2012.

* cited by examiner

THERMOSYPHON COOLING APPARATUS WITH ISOLATION OF COOLED COMPONENTS

BACKGROUND

The inventive subject matter relates to cooling systems for electronics apparatus and, more particularly, to cooling systems for power converters.

Power converters, such as rectifiers and inverters, are commonly used in industrial facilities, data centers and other applications. FIG. 1 illustrates a conventional rectifier that may be used, for example, in variable frequency drive applications. The rectifier includes an enclosure 110 that houses diode packages 120 that are interconnected by bus bars 60 to form a rectifier. The diode packages 120 are mounted on heat sinks 30 that are electrically insulated from one another. A blower 170 draws ambient air into the enclosure 110 such that cooling air moves over the heat sinks 30, dissipating heat generated by the diode packages 120.

SUMMARY

Some embodiments of the inventive subject matter provide an apparatus including an enclosure and a cooling system including at least one evaporator positioned in the enclosure and having a surface configured for mounting of a power electronic device thereon, a condenser positioned in and/or external to the enclosure, at least two electrically insulating conduits (e.g., rubber, ceramic, or plastic tubing) coupling the at least one evaporator and the condenser in a thermosyphon loop, and a dielectric coolant contained in the thermosyphon loop.

In some embodiments, each evaporator of the at least one evaporator may include an inlet, an input manifold coupled to the inlet, a plurality of parallel coolant channels coupled to the input manifold, an output manifold coupled to the plurality of parallel coolant channels, and an outlet coupled to the output manifold. In some embodiments, the condenser may include an inlet, an input manifold coupled to the inlet, a plurality of hollow plates coupled to the input manifold, an output manifold coupled to the plurality of hollow plates, and an outlet coupled to the output manifold.

In further embodiments, the at least one evaporator may include at least two evaporators connected in series by at least one electrically insulating coupler. In some embodiments, the at least one electrically insulating conduit may include flexible tubing.

In some embodiments, the apparatus may further include a plurality of power electronic devices, wherein each of the at least one evaporators has at least one of the power electronic devices mounted thereon. The apparatus may further include a blower attached to the enclosure and configured to generate an airflow that passes over the condenser. In some embodiments, the at least one evaporator may be positioned within the enclosure and the condenser may be positioned external to the enclosure.

Some embodiments of the inventive subject matter provide an apparatus including at least one evaporator having a surface configured for mounting of a power electronic device thereon, a condenser fluidically coupled to the at least one evaporator by at least two coolant conduits that electrically insulate the at least one evaporator from the condenser, and a dielectric coolant contained in a thermosyphon loop comprising the at least one evaporator, the condenser and the at least two coolant conduits. The at least one evaporator may include at least two evaporators fluidically coupled by at least one coupler that electrically insulates the at least two evaporators from one another.

Still further embodiments provide a rectifier apparatus including an enclosure and a cooling system at least partially disposed in the enclosure. The cooling system includes a plurality of evaporators, a condenser, at least two electrically insulating conduits coupling the plurality of evaporators and the condenser in a thermosyphon loop, and a dielectric coolant contained in the thermosyphon loop. The rectifier apparatus further includes a plurality of diodes electrically coupled to form a rectifier, respective groups of the diodes mounted on respective ones of the plurality of evaporators. The apparatus may further include a blower attached to the enclosure and configured to generate an airflow that passes over the condenser.

In some embodiments, the plurality of evaporators may include four evaporators and the plurality of diodes may include four groups of diodes. Each group may include at least one diode and respective groups of the four groups of diodes may be mounted on respective ones of the four evaporators. The apparatus may further include three electrically insulating couplers that couple the four evaporators in series and the at least two electrically insulating conduits may include a first electrically insulating conduit coupling a first one of the four evaporators to an inlet of the condenser and a second electrically insulating conduit coupling a second one of the four evaporators to an outlet of the condenser. In some embodiments, the apparatus may further include a first electrically insulating coupler coupling first and second evaporators of the four evaporators and a second electrically insulating coupler coupling third and fourth evaporators of the four evaporators, and the at least two electrically insulating conduits may include first and second electrically insulating conduits coupling the first and second evaporators, respectively, to the condenser and third and fourth electrically insulating couplers coupling the third and fourth evaporators, respectively, to the condenser. The at least two electrically insulating conduits may include respective pairs of electrically insulating conduits coupling respective ones of the four evaporators to the condenser.

DETAILED DESCRIPTION

Figure 1:
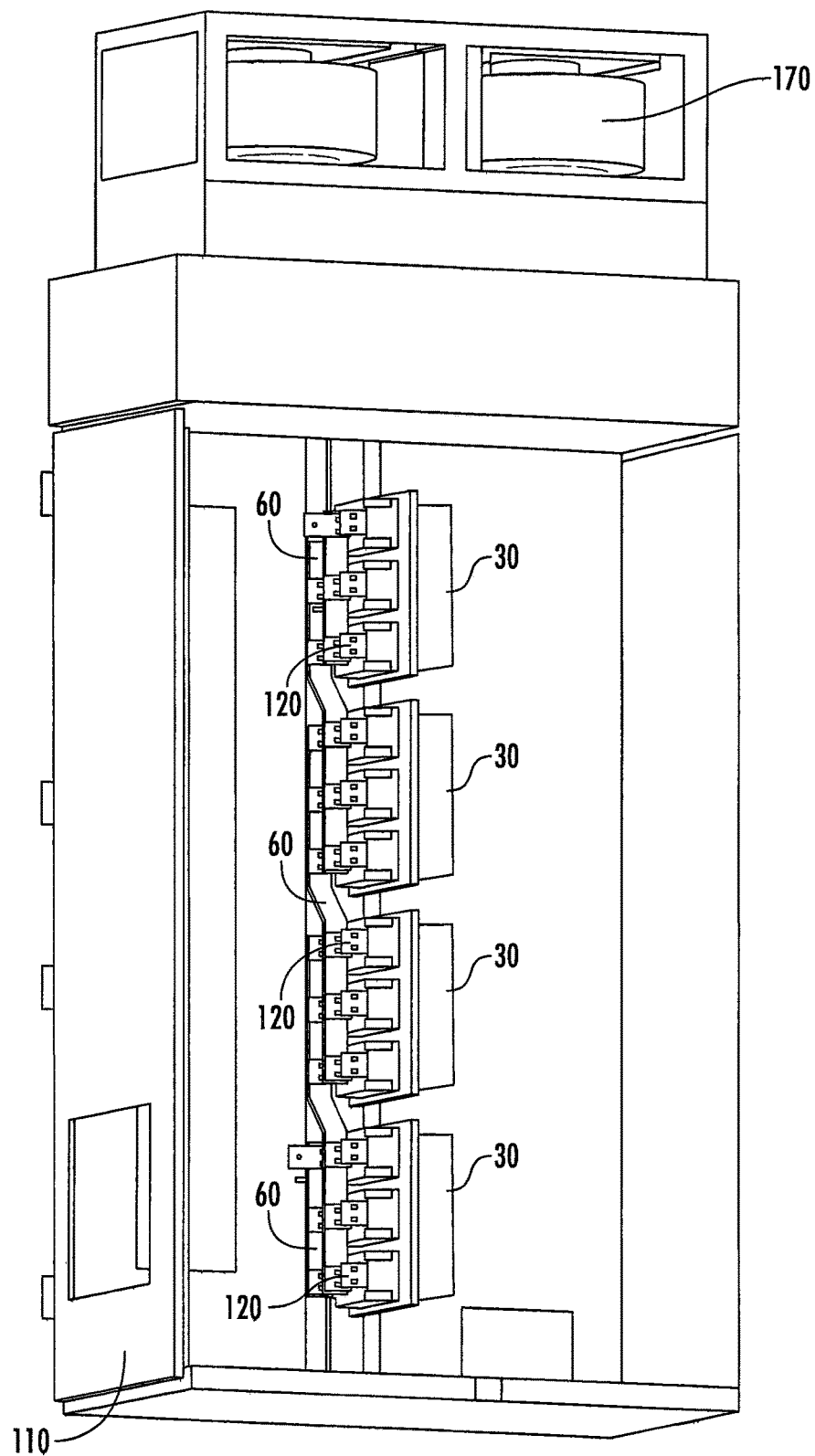
FIG. 1 illustrates a rectifier apparatus according to the prior art.

Specific exemplary embodiments of the inventive subject matter now will be described with reference to the accompanying drawings. This inventive subject matter may, however, be embodied in many different forms and should not be construed as limited to the embodiments set forth herein; rather, these embodiments are provided so that this disclosure will be thorough and complete, and will fully convey the scope of the inventive subject matter to those skilled in the art. In the drawings, like numbers refer to like items. It will be understood that when an item is referred to as being "connected" or "coupled" to another item, it can be directly connected or coupled to the other item or intervening items may be present. As used herein the term "and/or" includes any and all combinations of one or more of the associated listed items.

The terminology used herein is for the purpose of describing particular embodiments only and is not intended to be limiting of the inventive subject matter. As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, items, and/or components, but do not preclude the presence or addition of one or more other features, integers, steps, operations, items, components, and/or groups thereof.

Unless otherwise defined, all terms (including technical and scientific terms) used herein have the same meaning as commonly understood by one of ordinary skill in the art to which this inventive subject matter belongs. It will be further understood that terms, such as those defined in commonly used dictionaries, should be interpreted as having a meaning that is consistent with their meaning in the context of the specification and the relevant art and will not be interpreted in an idealized or overly formal sense unless expressly so defined herein.

Embodiments of the inventive subject matter are described below with reference to a thermosyphon cooling system for a rectifier apparatus. It will be appreciated that these embodiments are shown for purposes of illustration and that embodiments of the inventive subject matter are not limited thereto. For example, cooling systems and methods according to further embodiments may be used in other types of apparatus, such as power converters (e.g., inverters), uninterruptible power supplies (UPSs), power supply devices used in data centers, switchgear and other apparatus that include power electronic components that generate significant amounts of heat, such as power diodes, transistors (e.g., insulated gate bipolar transistors (IGBTs) or power MOSFETs), silicon-controlled rectifiers (SCRs), gate turn-on devices (GTOs), thyristors and the like.

Figure 2:
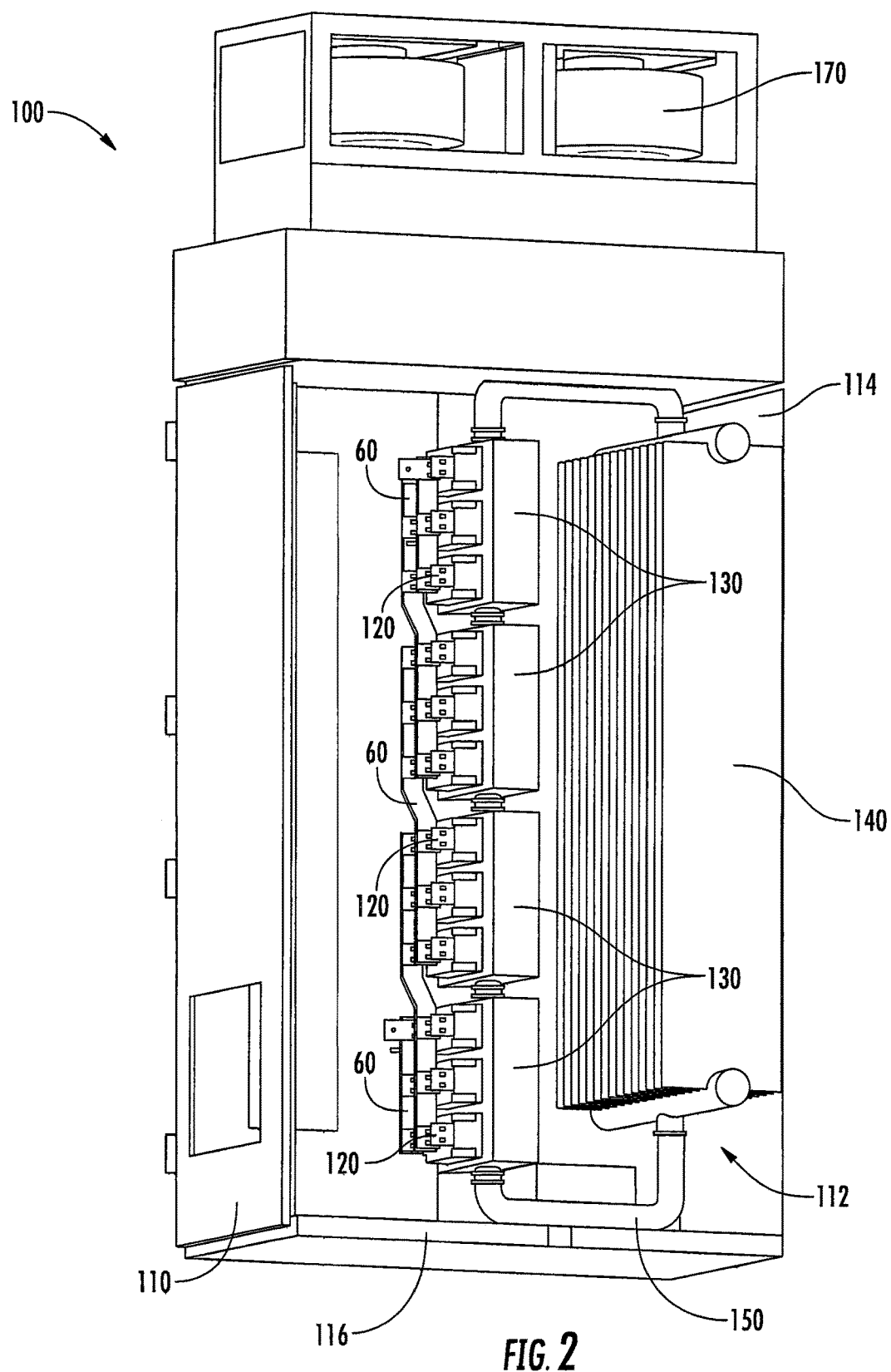
FIG. 2 is a schematic diagram illustrating a rectifier apparatus according to some embodiments of the inventive subject matter.

FIG. 2 illustrates a rectifier apparatus 100 according to some embodiments of the inventive subject matter. The apparatus 100 includes an enclosure 110 having opposing long walls 114 and opposing short walls 116 which define a contained volume 112. Housed within the contained volume 112 is a plurality of diode packages 120, which include diodes that may be interconnected to form a rectifier, as described below with reference to FIG. 12. The diode packages 120 are cooled by a thermosyphon cooling system including a condenser 140 disposed adjacent one of the long walls 114 and a plurality of evaporators 130 arranged in a row on an opposite side of the condenser 140 from the long wall 114. Respective groups of the diode packages 120 are mounted on respective ones of the evaporators 130. It will be understood that further embodiments of the inventive subject matter may use other arrangements of thermosyphon cooling system components, such as arrangements wherein portions of the cooling system may be positioned outside of the enclosure housing the electronic components being cooled. For example, some embodiments may use a condenser, such as the condenser 140, placed outside of an enclosure as depicted, for example, in FIG. 11, which is described in greater detail below.

Figure 3:
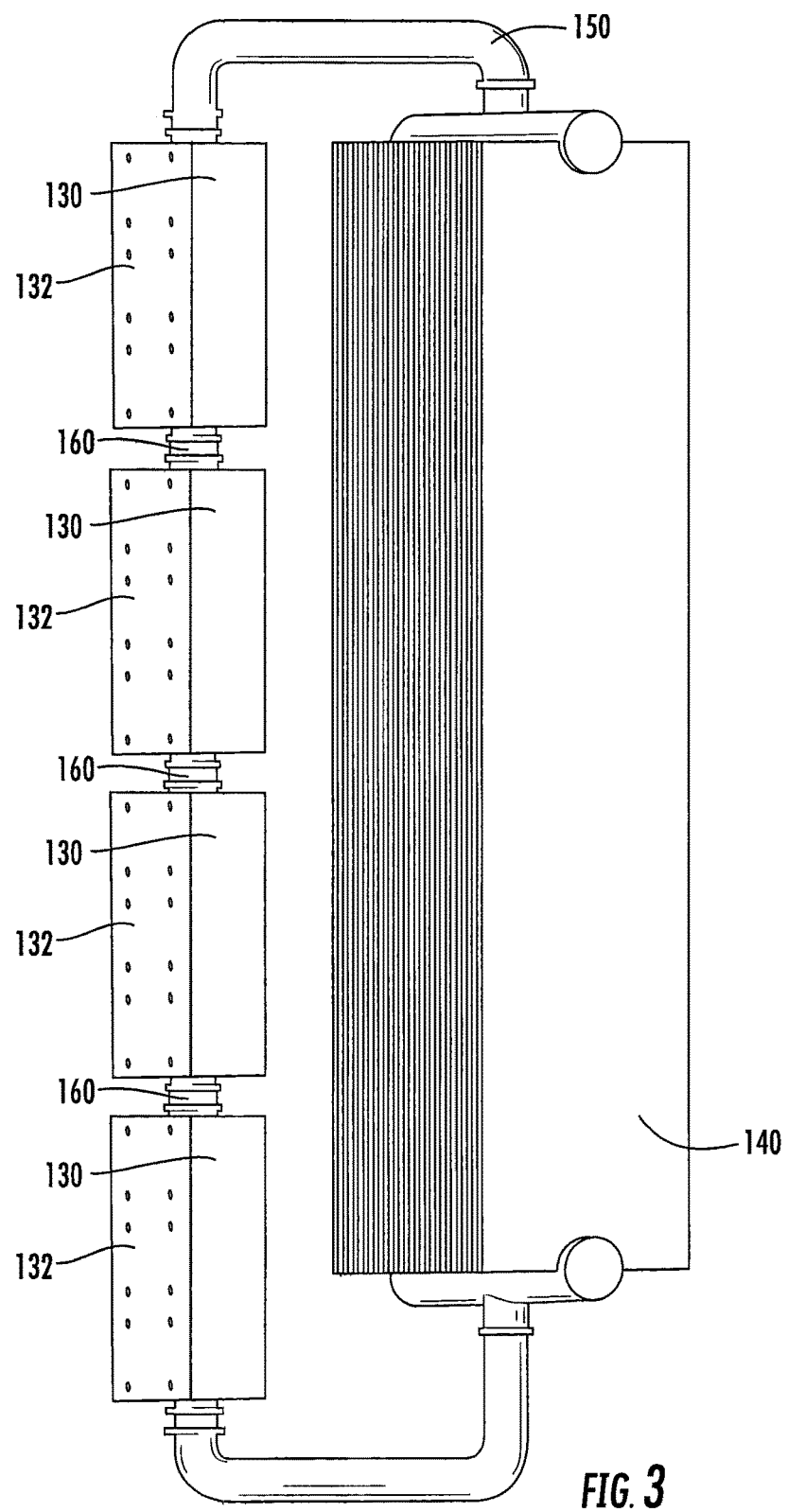
FIG. 3 illustrates a thermosyphon cooling system of the rectifier apparatus of FIG. 2.

Referring to FIGS. 2 and 3, the evaporators 130 are coupled together by electrically insulating fluid couplers 160 and to the condenser 140 via electrically insulating conduits 150. The couplers 160 may be formed from, for example, a plastic, ceramic or other insulating material, and the conduits 150 may be made of, for example, rubber tubing, plastic pipe or other insulating material. A dielectric (electrically insulating) coolant, such as HFC 4310, is contained within the thermosyphon loop formed by the evaporators 130, couplers 160, conduits 150 and condenser 140. The use of the electrically insulating conduits 150, the electrically insulating couplers 160 and the dielectric coolant provides electrical isolation of the evaporators 130 from one another and from the condenser 140. The diode packages 120 may have base plates and/or other external surfaces that are electrically coupled to active terminals (e.g., cathodes or anodes) of the diodes therein, and isolation of the evaporators 130 can allow direct mounting of such active surfaces of the diode packages 120 on surfaces of the evaporators 130 without the use of intervening insulators. This can improve heat transfer, reduce parts count and simplify assembly.

A blower 170 draws air into one or more vents 118 in the housing 110, such that the cooling air passes over the condenser 140 and passes into the blower 170. It will be appreciated, however, that other heat exchange techniques may be used for the condenser 140. For example, some embodiments may use convection cooling without requiring a blower or other air moving device. Some embodiments may use liquid cooling to transfer heat from the condenser 140. For example, cooling water pumped through a heat exchanger thermally coupled to the condenser 140 may be used to provide heat transfer from the condenser 140.

In the thermosyphon loop, coolant in a liquid state is fed into the bottom of the series of evaporators 130, with heat from the diode packages 120 causing the liquid coolant to vaporize and pass through the upper conduit 150 into the condenser 140, where it condenses back into liquid form as heat is transferred out of the condenser 140 and into the moving cooling air. The enclosure 110 may be configured for vertical mounting as oriented in FIG. 2, supporting gravity flow of condensed liquid coolant downward in the condenser 140 to support operation of the thermosyphon cooling system.

Figure 4:
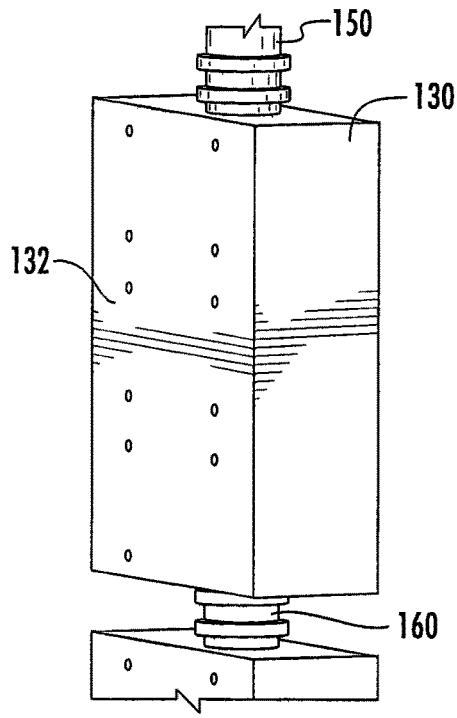
FIGS. 4 and 5 are detailed views of evaporators of the thermosyphon cooling system of FIG. 3.
Figure 5:
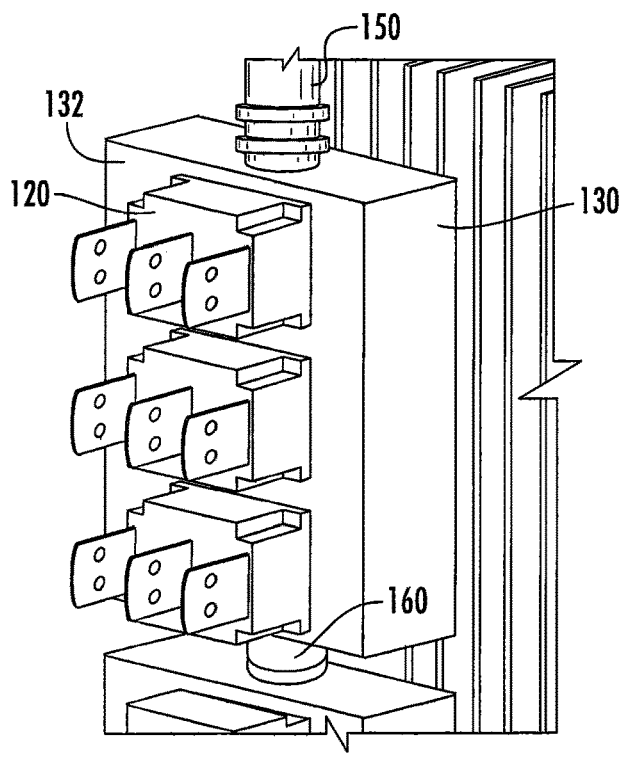
Figure 6:
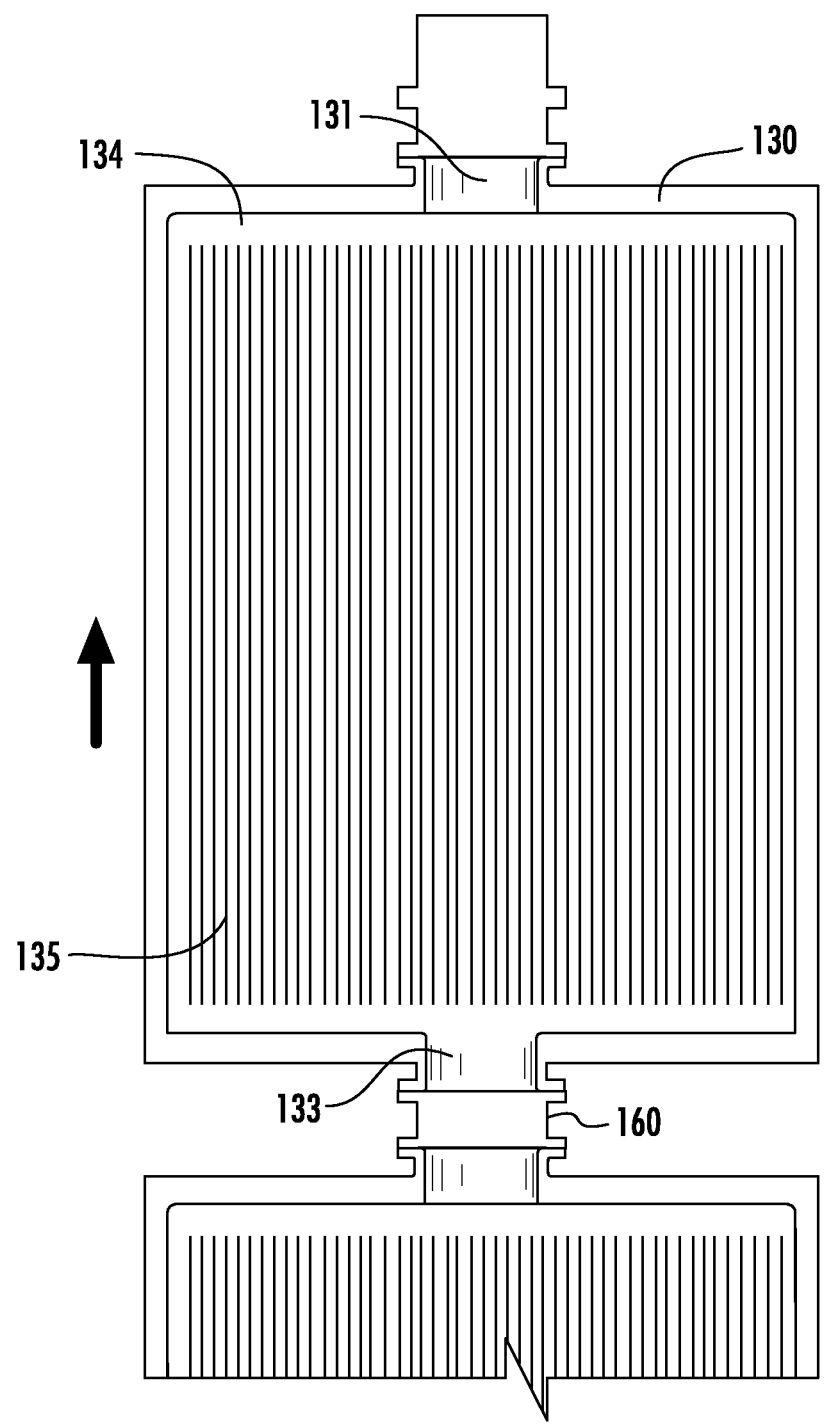
FIG. 6 is a cutaway view of an evaporator of the thermosyphon cooling system of FIG. 3.

FIGS. 4-7 illustrate various components of the cooling system. Referring to FIG. 4, the evaporators 130 have mounting surfaces 132 that are configured with threaded holes to facilitate mounting of the diode packages 120, as shown in FIG. 5. Referring to FIG. 6, each evaporator 130 may include an inlet 131 and an outlet 133. Coolant entering the inlet 131 passes into an input manifold 134 that feeds a plurality of parallel coolant channels 135. The parallel channels 135 reduce pressure drop across the evaporator 130 and can reduce the likelihood of hot spots and flow recirculation. Coolant exiting the channels 135 passes into an output manifold and on to the outlet 133.

Figure 7:
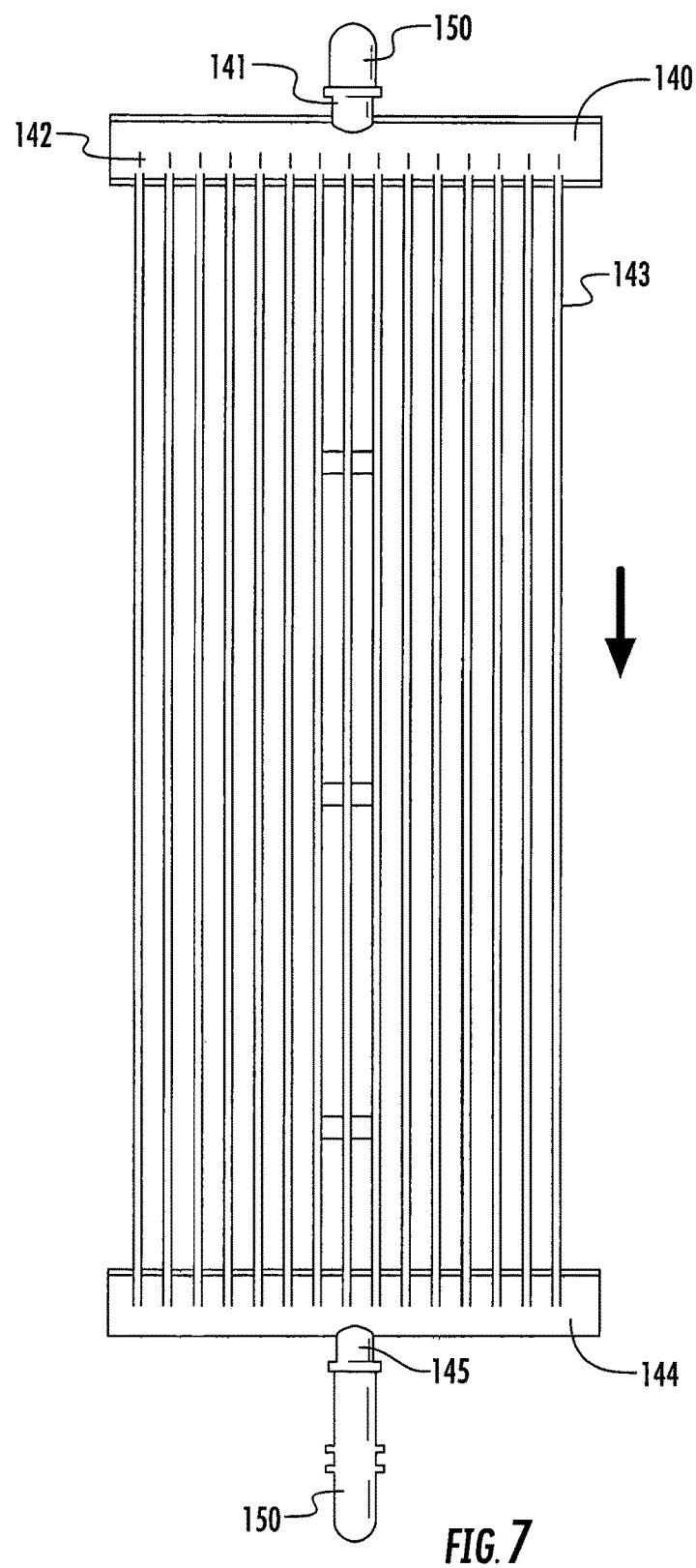
FIG. 7 is a detailed view of a condenser of the thermosyphon cooling system of FIG. 3.

Referring to FIG. 7, the condenser 140 includes an inlet 141 through which coolant passes into an input manifold 142. The input manifold 142 distributes the coolant vapor and/or liquid to multiple parallel hollow rectangular plates 143 that provide increased surface area for transferring heat from the coolant to the surrounding air flow. Condensed coolant passes to an output manifold 144 and passes out of the condenser 140 via an outlet 145 for recirculation through the series of evaporators 130. It will be appreciated that other embodiments may employ condensers having other forms. For example, in some embodiments, a thermosyphon cooling system may use condensers in the form of a shell-in-tube heat exchanger or other type of heat exchangers that use various types of coolants to transfer heat from the thermosyphon loop.

Figure 8:
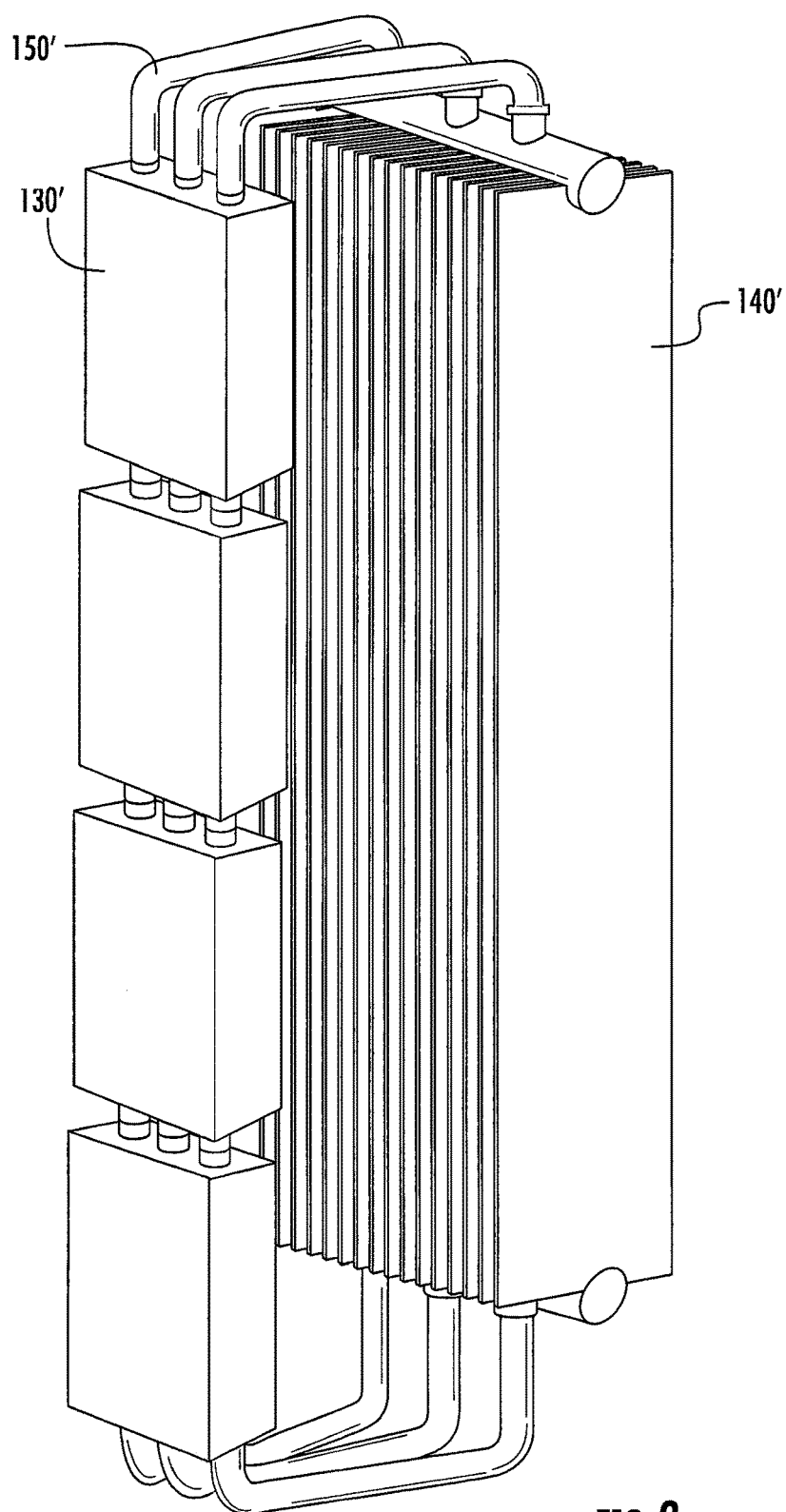
FIG. 8 illustrates a thermosyphon cooling system according to further embodiments.
Figure 9:
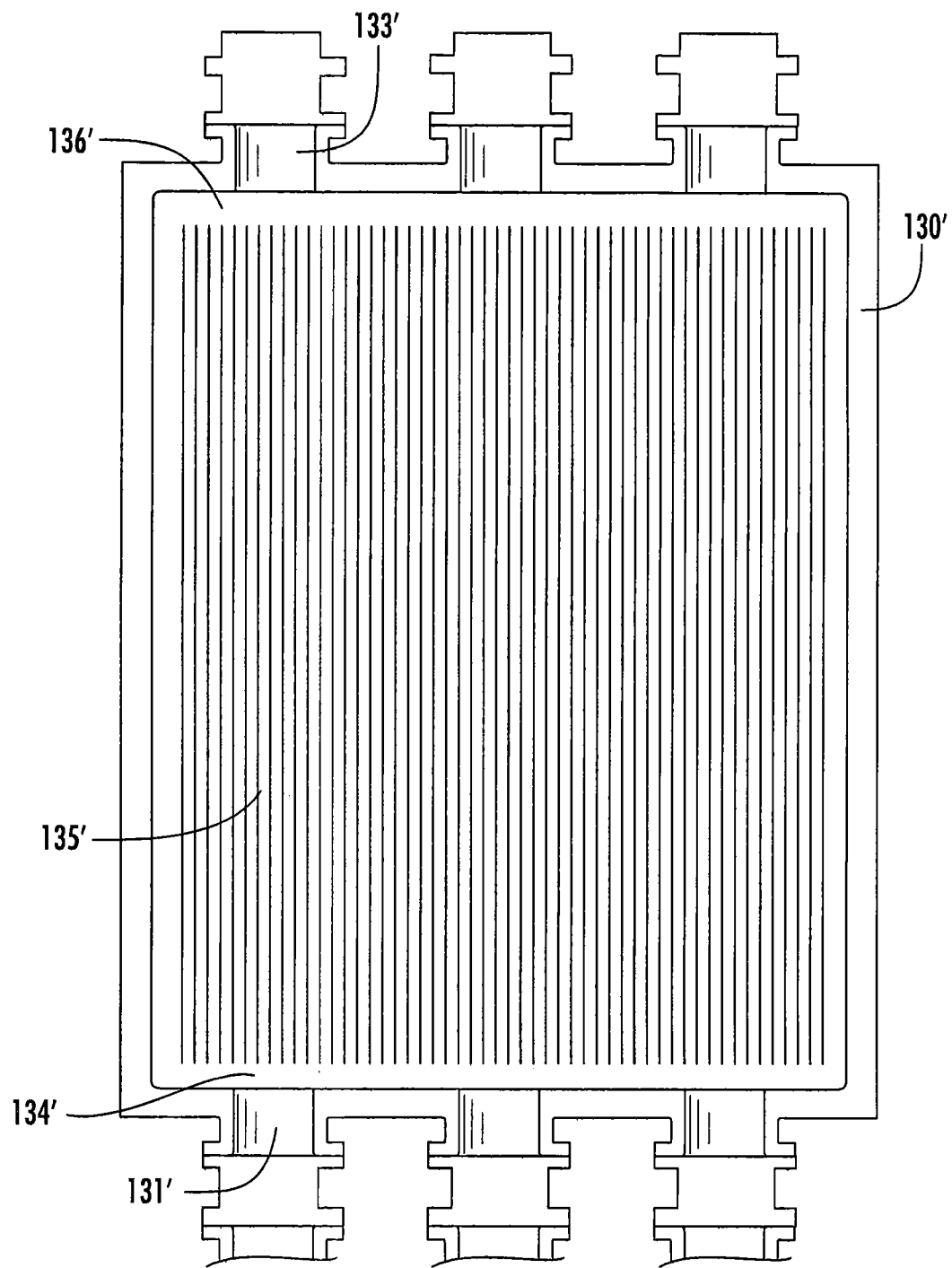
FIG. 9 is a cutaway view of an evaporator of the thermosyphon cooling system of FIG. 8.

Further embodiments may include variations of the arrangement shown in FIGS. 2-7. For example, referring to FIG. 8, multiple parallel coolant conduits 150' may be used to connect evaporators 130' to a condenser 140'. Referring to FIG. 9, each evaporator 130' includes three inlets 131 which feed an input manifold 136' that distributes coolant to parallel coolant channels 135'. Coolant exiting the channels 135' passes into an output manifold 136' and on to outlets 133'. This arrangement can reduce inlet drop pressure and provide more uniform flow distribution in the evaporator 130'.

Figure 10:
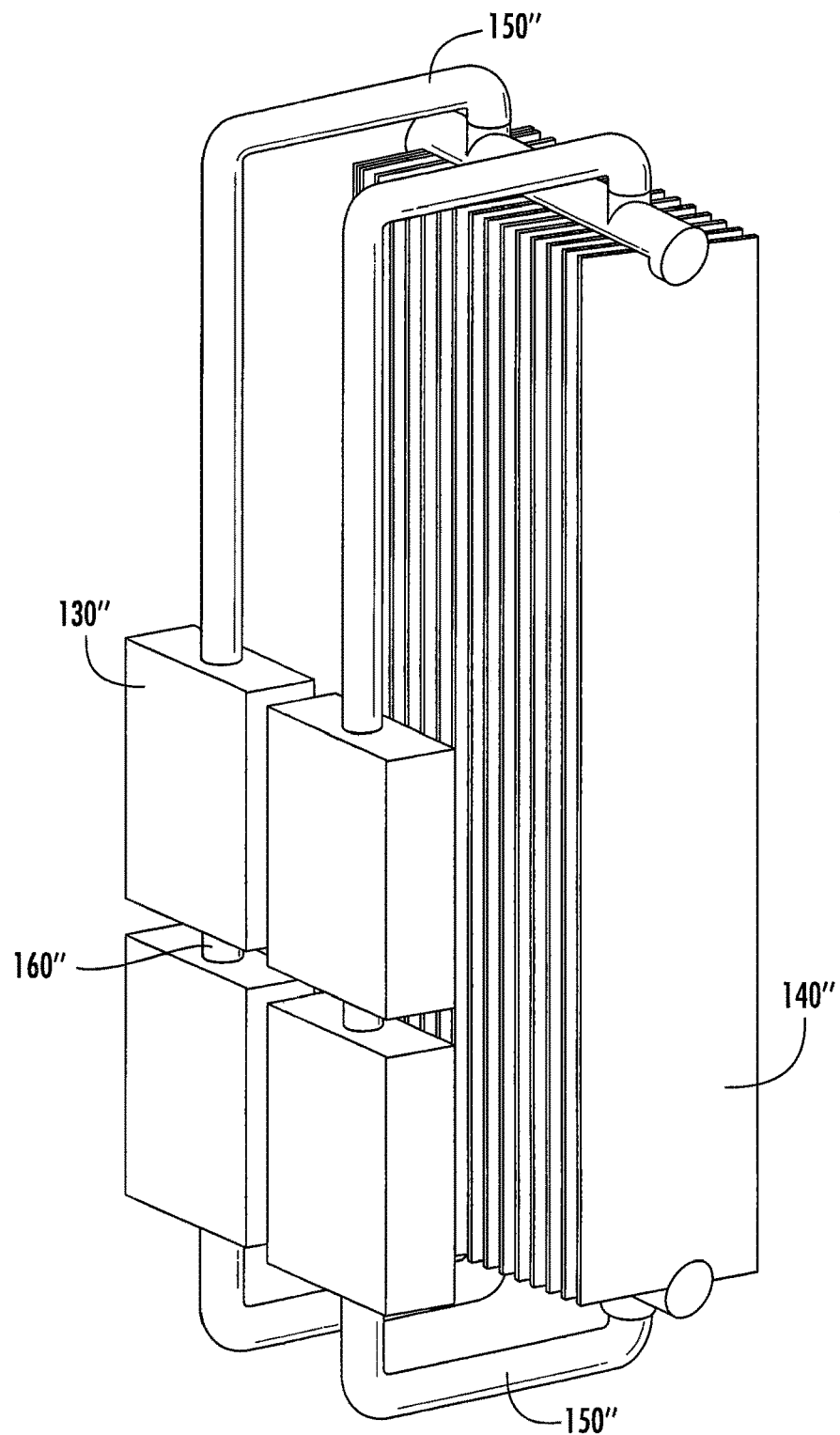
FIG. 10 illustrates a thermosyphon cooling system according to still further embodiments.

FIG. 10 illustrates further embodiments wherein pairs of series-connected evaporators 130" are connected separately to a condenser 140' via conduits 150." This can provide increased heat dissipation capability, as this configuration may provide a greater vertical distance between the evaporators 130" and the condenser 140". In still further embodiments, each evaporator may have separate conduit links to the condenser, i.e., four evaporators in parallel, to provide greater dissipation capability.

Figure 11:
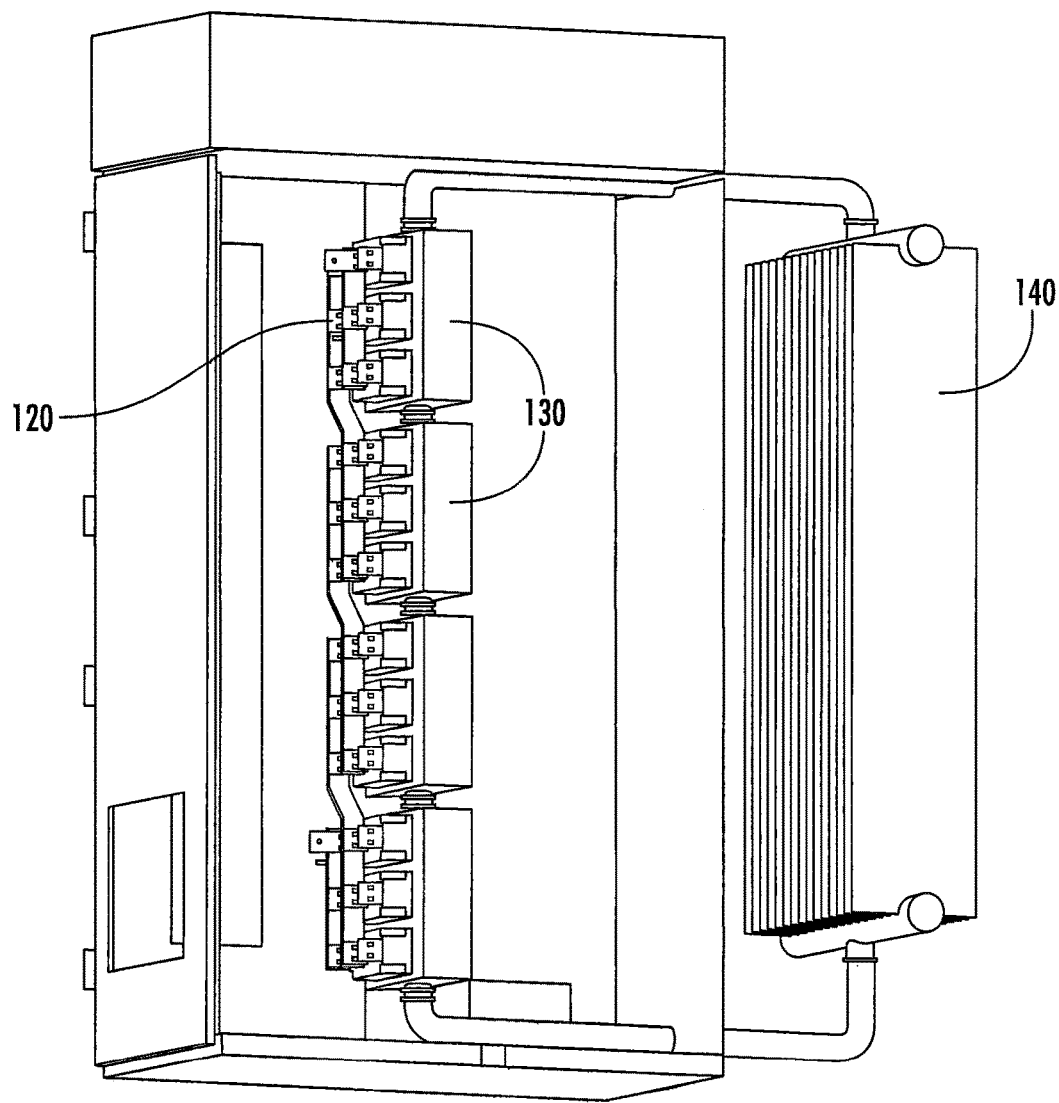
FIG. 11 illustrates a rectifier apparatus with an external condenser according to some embodiments.

FIG. 11 illustrates an alternative rectifier apparatus 100' according to further embodiments. The apparatus 100 is similar to the apparatus 100 illustrated in FIG. 2, but places the condenser 140 outside of the enclosure 110. It will be appreciated that such an arrangement may allow for elimination of a blower unit and vents for providing air movement within the enclosure 110, as the condenser 140 may be cooled by means external to the enclosure.

Figure 12:
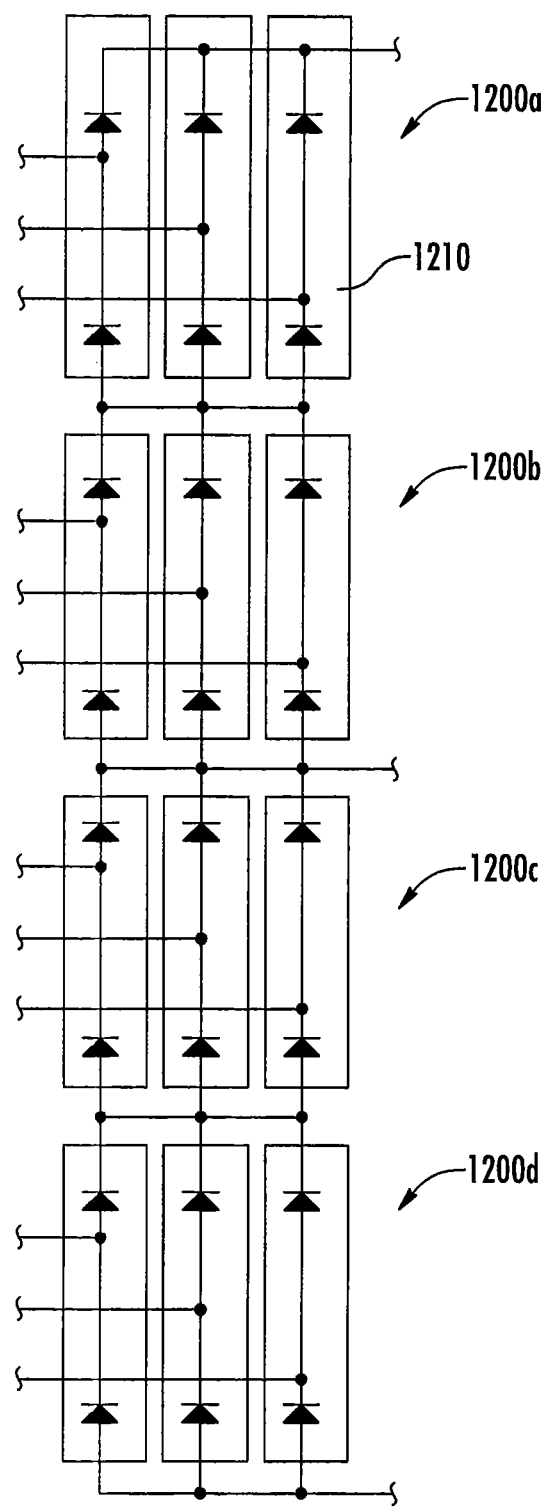
FIG. 12 is a circuit diagram for the rectifier apparatus of FIG. 2.

FIG. 12 is a circuit diagram illustrating an example of diode circuitry that may be used in some embodiments. Groups of diode packages 1200a, 1200b, 1200c, 1200d each include 3 diode packages 1210 containing diodes interconnected to provide a 24-pulse rectifier. Respective ones of the groups 1200a, 1200b, 1200c, 1200d may be mounted on respective evaporators, such as the evaporators 130 shown in FIG. 2. It will be appreciated that the circuit arrangement shown in FIG. 12 is an example, and that a variety of other arrangements of diodes or other semiconductor devices may be used in various embodiments of the inventive subject matter.

In the drawings and specification, there have been disclosed exemplary embodiments of the inventive subject matter. Although specific terms are employed, they are used in a generic and descriptive sense only and not for purposes of limitation, the scope of the inventive subject matter being defined by the following claims.

That which is claimed:

1. An apparatus comprising:
   an enclosure;
   a cooling system comprising:
   at least three evaporators disposed in the enclosure and having respective surfaces configured for mounting of a power electronic device thereon, the evaporators fluidically coupled in series by respective electrically insulating couplers between adjacent ones of the evaporators;
   a condenser positioned in and/or external to the enclosure;
   at least two electrically insulating conduits coupling the evaporators and the condenser in a thermosyphon loop; and
   a dielectric coolant contained in the thermosyphon loop.

2. The apparatus of claim 1, wherein each of the evaporators comprises:
   an inlet;
   an input manifold coupled to the inlet;
   a plurality of parallel coolant channels coupled to the input manifold;
   an output manifold coupled to the plurality of parallel coolant channels; and
   an outlet coupled to the output manifold.

3. The apparatus of claim 1, wherein the condenser comprises:
   an inlet;
   an input manifold coupled to the inlet;
   a plurality of hollow plates coupled to the input manifold;
   an output manifold coupled to the plurality of hollow plates; and
   an outlet coupled to the output manifold.

4. The apparatus of claim 1, wherein the at least two electrically insulating conduits comprise flexible tubing.

5. The apparatus of claim 1, further comprising a plurality of power electronic devices, wherein each of the evaporators has at least one of the power electronic devices mounted thereon.

6. The apparatus of claim 1, further comprising a blower attached to the enclosure and configured to generate an airflow that passes over the condenser.

7. The apparatus of claim 1, wherein the evaporators are positioned within the enclosure and wherein the condenser is positioned external to the enclosure.

8. The apparatus of claim 1, wherein the evaporators are vertically aligned such that a first one of the evaporators overlies a second one of the evaporators.

9. The apparatus of claim 8, wherein an inlet of the first one of the evaporators overlies an outlet of the second one of the evaporators, and wherein one of the electrically insulating couplers provides a direct vertical fluid path between the inlet and the outlet.

10. An apparatus comprising:
    at least three evaporators having respective surfaces configured for mounting of a power electronic device thereon and fluidically coupled in series by respective electrically insulating couplers between adjacent ones of the evaporators;
    a condenser fluidically coupled to the evaporators by at least two-coolant conduits that electrically insulate the evaporators from the condenser; and
    a dielectric coolant contained in a thermosyphon loop comprising the evaporators, the condenser and the at least two coolant conduits.

11. The apparatus of claim 10, farther comprising:
    an enclosure containing the evaporators; and
    respective power electronic devices mounted on respective ones of the evaporators.

12. The apparatus of claim 11, wherein the condenser is positioned within the enclosure.

13. A rectifier apparatus comprising:
an enclosure;
a cooling system at least partially disposed in the enclosure and comprising:
   at least three evaporators fluidically coupled in series by respective electrically insulating couplers between respective adjacent ones of the evaporators;
   a condenser;
   at least two electrically insulating conduits coupling the evaporators and the condenser in a thermosyphon loop; and
   a dielectric coolant contained in the thermosyphon loop; and
a plurality of diodes electrically coupled to form a rectifier, respective groups of the diodes mounted on respective ones of the evaporators.

14. The rectifier apparatus of claim 13, further comprising a blower attached to the enclosure and configured to generate an airflow that passes over the condenser.

15. The rectifier apparatus of claim 13, wherein the evaporators comprise four evaporators fluidically coupled in series by three electrically insulating couplers, wherein the plurality of diodes comprises four groups of diodes and wherein respective groups of the four groups of diodes are mounted on respective ones of the four evaporators.

16. The rectifier apparatus of claim 15, wherein the at least two electrically insulating conduits comprise a first electrically insulating conduit coupling a first one of the four evaporators to an inlet of the condenser and a second electrically insulating conduit coupling a second one of the four evaporators to an outlet of the condenser.

17. The rectifier apparatus of claim 13, wherein the condenser comprises a plurality of parallel hollow plates.

* * * * *

UNITED STATES PATENT AND TRADEMARK OFFICE
CERTIFICATE OF CORRECTION

| | | |
|---|---|---|
| PATENT NO. | : 10,178,803 B2 | Page 1 of 1 |
| APPLICATION NO. | : 15/068220 | |
| DATED | : January 8, 2019 | |
| INVENTOR(S) | : Abhinav Dixit et al. | |

It is certified that error appears in the above-identified patent and that said Letters Patent is hereby corrected as shown below:

In the Claims

Column 6, Line 45, please delete "-" before "a."

Signed and Sealed this
Eighteenth Day of June, 2019

Andrei Iancu
*Director of the United States Patent and Trademark Office*